United States Patent
An et al.

(10) Patent No.: US 10,199,988 B2
(45) Date of Patent: Feb. 5, 2019

(54) METHOD FOR CONTROLLING POWER GRID FREQUENCY OF MULTIPLE ENERGY STORAGE SYSTEMS, AND SYSTEM THEREFOR

(71) Applicant: HYOSUNG HEAVY INDUSTRIES CORPORATION, Seoul (KR)

(72) Inventors: Geon Ho An, Incheon (KR); In Sun Choi, Gunpo-si (KR); Dong Jun Won, Incheon (KR); Jin Young Choi, Bucheon-si (KR); Jin Sun Yang, Bucheon-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 0 days.

(21) Appl. No.: 15/538,642

(22) PCT Filed: Dec. 22, 2015

(86) PCT No.: PCT/KR2015/014129
§ 371 (c)(1),
(2) Date: Jun. 21, 2017

(87) PCT Pub. No.: WO2016/105103
PCT Pub. Date: Jun. 30, 2016

(65) Prior Publication Data
US 2018/0006607 A1 Jan. 4, 2018

(51) Int. Cl.
*H03B 19/00* (2006.01)
*H03D 7/16* (2006.01)
*H02J 3/36* (2006.01)

(52) U.S. Cl.
CPC ............. *H03D 7/165* (2013.01); *H02J 3/36* (2013.01); *Y02E 60/60* (2013.01)

(58) Field of Classification Search
CPC ..................................................... H03D 7/165
See application file for complete search history.

(56) References Cited

U.S. PATENT DOCUMENTS 9,425,620 B2 * 8/2016 Chassin ................. G06Q 10/06
2014/0239913 A1 8/2014 Kudo et al.

FOREIGN PATENT DOCUMENTS

JP          2003284244 A   10/2003
KR   1020100105435 A    9/2010
(Continued)

OTHER PUBLICATIONS

Yang, Jin-Sun et al., "SOC Management of BESS for Governor Free Control", Transactions of the Korean Institute of Electrical Engineers Summer Conference 2014, Jul. 2014, pp. 215-216.
(Continued)

*Primary Examiner* — Daniel Puentes
(74) *Attorney, Agent, or Firm* — Novick, Kim & Lee, PLLC; Jae Youn Kim

(57) ABSTRACT

The present invention relates to a power management system (PMS) for multiple energy storage systems (ESS) that is for integrated management of the system having multiple ESS for controlling a frequency and having a hierarchical control structure. The PMS for ESS comprises: a plurality of ESS; a local management system (LMS) for managing one or more ESS of the plurality of ESS for each local unit; an ESS Controller (ESSC) for general management of the LMS, judging a state of the LMS and determining an output value of one or more ESS in the LMS, and transmitting the determined output value to the respective ESS; and a PMS for general management of the entire system comprising the plurality of ESS, the LMS and the ESSC, judging the state of the entire system and participating in a power grid frequency control market through a grid operator contract,
(Continued)

controlling the output of the LMS, and adjusting a control parameter for output control.

10 Claims, 10 Drawing Sheets

(56) References Cited

FOREIGN PATENT DOCUMENTS

| KR | 1020130102681 A | 9/2013 |
|----|-----------------|--------|
| KR | 1020140068331 A | 6/2014 |

OTHER PUBLICATIONS

International Search Report in International Application No. PCT/KR2015/014129, dated Apr. 11, 2016.

* cited by examiner

METHOD FOR CONTROLLING POWER GRID FREQUENCY OF MULTIPLE ENERGY STORAGE SYSTEMS, AND SYSTEM THEREFOR

CROSS-REFERENCE TO RELATED APPLICATIONS

This application is the National Stage filing under 35 U.S.C. 371 of International Application No. PCT/KR2015/014129, filed on Dec. 22, 2015, which claims the benefits of Korean Patent Application No. 10-2014-0186500, filed on Dec. 22, 2014, the contents of which are all hereby incorporated by reference herein in their entirety.

TECHNICAL FIELD

The present invention relates to a power grid frequency control method and power grid frequency control system for multiple energy storage systems, and more particularly, to power grid frequency control method and power grid frequency control system for multiple energy storage systems, capable of managing electric power by controlling a power grid frequency for multiple energy storage systems in a hierarchical control structure.

BACKGROUND ART

In general, a frequency control ancillary service (FCAS) is a service for maintaining a power grid frequency during a normal operating state and a contingency event (such as generator outage or a failure in a transmission line) within a range of 60±0.2 Hz defined in the electricity law. The FCAS can be classified into a frequency response ancillary service or a primary frequency control, a frequency regulation ancillary service or a secondary frequency control, an economic dispatch or tertiary frequency control depending on a response time.

In this regard, the FCAS tries to contribute to maintaining a proper frequency using an automatic generation control (AGC) in order to allow correction of an error that may be generated due to imbalance between supply and demand unlike a normal operating state to comply with the dispatch schedule, correction of a difference in a generation capability to comply with the dispatch schedule, fast frequency recovery in a contingency event.

The frequency response ancillary service may be provided by a governor of a generator or a contracted interruptible load in order to suppress abrupt frequency reduction in a power grid system in a particular contingency event or maintain the lowered frequency state for a certain time.

Korean patent application publication No. 2013-0102681 discusses a technique in which how many energy storage systems are available and whether or not an energy storage system is rejected are determined by setting priorities of energy storage systems depending on the state of charge (SOC) of the energy storage system, discharging is performed when the frequency supplied to a system load decreases, and charging is performed when the frequency supplied to the system load increases. However, this technique of the related art is not applicable to the AGC or the frequency control operating at a standard frequency of the power grid frequency control market and a frequency dead band disadvantageously.

SUMMARY OF INVENTION

Technical Problem

In view of the aforementioned problems, the present invention provides a power grid frequency control method and a power grid frequency control system for multiple energy storage systems, capable of providing a hierarchical control structure and output algorithm for efficient frequency control management for multiple energy storage systems.

The present invention also provides a power grid frequency control method and a power grid frequency control system for multiple energy storage systems, capable of performing a frequency control using energy storage systems structured in a hierarchical control system and determining an energy use ratio between the frequency response and the frequency regulation through the existing data analysis.

Technical Solution

According to an aspect of the present invention, there is provided a power grid frequency control system for controlling a power grid frequency for multiple energy storage systems using a hierarchical control structure, including: a plurality of energy storage systems (ESSs); a local management system (LMS) configured to manage at least one of the energy storage systems on a local basis; an energy storage system controller (ESS controller) configured to generally control the local management system by determining a state of the local management system, estimating an output value of at least one of the energy storage systems belonging to the local management system, and transmitting the estimated output value to each energy storage system; and a power management system (PMS) configured to generally manage overall systems including the plurality of energy storage systems, the local management system, and the energy storage system controller, determine states of the overall systems to allow a user to participate in a power grid frequency control market by making a contract with a system operator, control an output value of the local management system, and regulate control parameters for controlling the output value.

When a plurality of the energy storage system controllers are provided, the power management system determines control parameters for controlling frequencies of the energy storage system controllers, sets a participating energy ratio for a frequency response and frequency regulation control depending on a frequency state on the basis of the determined control parameters, and performs the frequency response and frequency regulation control depending on the set participating energy ratio.

According to another aspect of the present invention, there is provided a power grid frequency control method in a power grid frequency control system including a plurality of energy storage systems (ESSs), a local management system (LMS) configured to manage at least one of the energy storage systems on a local basis, an energy storage system controller (ESS controller) configured to generally control the local management system by determining a state of the local management system, estimating an output value of at least one of the energy storage systems belonging to the local management system, and transmitting the estimated output value to each energy storage system, and a power management system (PMS) configured to generally manage overall systems including the plurality of energy storage systems, the local management system, and the energy storage system controller, determine states of the overall systems to allow a user to participate in a power grid frequency control market by making a contract with a system operator, control an output value of the local management system, and regulate control parameters for controlling the output value, the power grid frequency control method comprising: determining control parameters for controlling frequencies of the energy storage system controllers when a plurality of the energy storage system controllers are provided, setting a participating energy ratio for a frequency response and frequency regulation control depending on a frequency state on the basis of the determined control parameters, and performing the frequency response and frequency regulation control depending on the set participating energy ratio.

Advantageous Effects

As described above, using the power grid frequency control method and the power grid frequency control system for multiple energy storage systems according to the present invention, the multiple energy storage systems are combined, and the output control is performed in cooperation with each other. Therefore, it is possible to establish flexible energy management and improve safety and accuracy of the system.

Using the power grid frequency control method and the power grid frequency control system for multiple energy storage systems according to the present invention, it is possible to improve system reliability by increasing an operation rate of the entire system through complementary maintenance.

Using the power grid frequency control method and the power grid frequency control system for multiple energy storage systems according to the present invention, it is possible to easily extend the lower-layer energy storage systems due to the hierarchical control structure.

DESCRIPTION OF EMBODIMENTS

Figure 1:
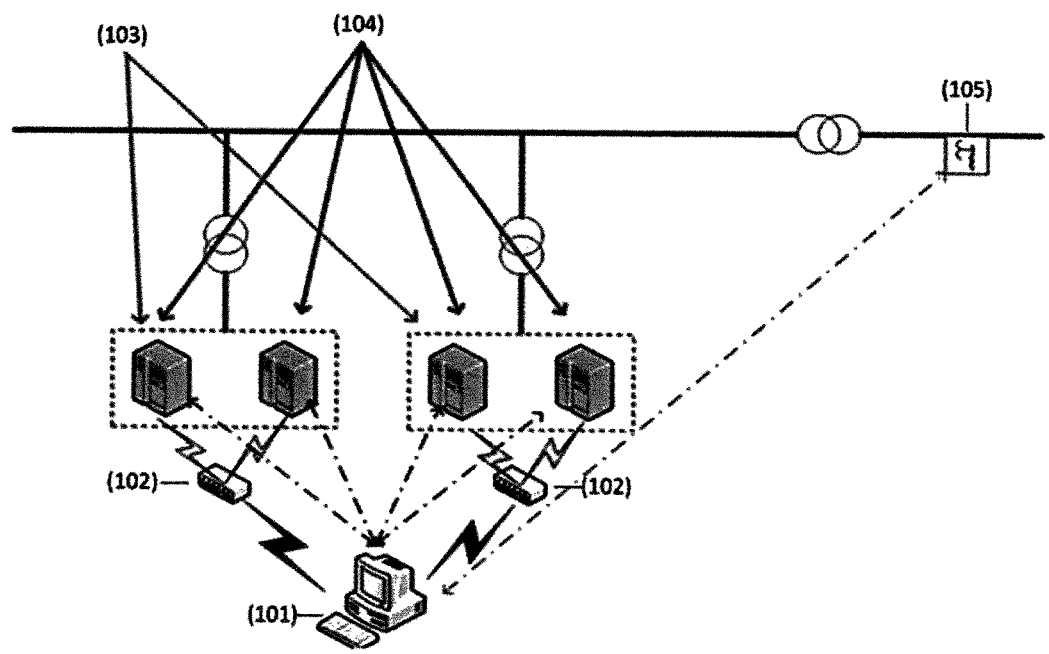
FIG. 1 is a schematic diagram illustrating multiple energy storage systems for a frequency control according to an embodiment of the present invention.

Preferred embodiments of the present invention will now be described in details with reference to the accompanying drawings. Note that like reference numerals denote like elements through the drawings. In the following description, any configuration or function well known in the art may not be described if its detailed description obscures a subject matter of the present invention.

Various aspects of the present invention will now be described. The inventions disclosed herein may be embodied in various forms. Therefore, it would be appreciated that any particular structure and/or function disclosed herein is merely for illustrative purposes. A person ordinarily skilled in the art would appreciate that any aspect disclosed herein may be embodied independently from any other aspect, and two or more aspects may be combined in various manners on the basis of this disclosure. For example, a device or method may be implemented or embodied using any number of aspects described herein. In addition, such a device or method may be implemented in addition to one or more aspects disclosed herein or using any structure and/or function other than these aspects.

Preferred embodiments of the present invention will now be described in details with reference to the accompanying drawings.

FIG. 1 is a schematic diagram illustrating multiple energy storage systems for a frequency control according to an embodiment of the present invention.

Referring to FIG. 1, the multiple energy storage systems for a frequency control according to the present invention may include a plurality of energy storage systems (ESSs) 104, a local management system (LMS) 103, an energy storage system controller (ESS controller) 102, and a power management system (PMS) 101.

The energy storage system 104 may include a power source capable of storing and supplying electric energy and a power converter capable of controlling the power. The power source of the energy storage system 104 may include various power supply devices such as a battery, a super capacitor, a fuel cell, and a flywheel. The energy storage system (104) is required to provide a rating capacity capable of maintaining a rating output power at least for fifteen minutes in order to participate in the frequency control market.

The local management system 103 may manage at least one of multiple energy storage systems on a local basis. That is, the local management system 103 may mean a minimum unit capable of managing power distribution of multiple energy storage systems.

The energy storage system controller 102 may generally manage the local management system 103. That is, the energy storage system controller 102 determines a state of the local management system 103 to determine output values for a plurality of energy storage systems 104 belonging to the local management system 103 and transmit the determined output values to the energy storage systems 104. In addition, the energy storage system controller 102 may have an interface for controlling system monitoring for maintenance of the local management system 103 and providing various types of information such as operational information of the system. Furthermore, the energy storage system controller 102 may be included in the power management system 101.

The power management system 101 may generally manage the entire system. That is, the power management system 101 may determine a state of the entire system to allow a user to participate in the power grid frequency control market by making a contract with a system operator, control the output of the local management system 103 using a particular algorithm, and adjust control parameters. The algorithm for controlling the output of the local management system 103 and the algorithm for adjusting the control parameter will be described below with reference to FIGS. 2 to 3. In addition, the power management system 101 may have an interface capable of controlling system monitoring for maintenance of the entire system and providing information such as a state of the frequency control market, a system state, and a system income to a service provider.

Therefore, as illustrated in FIG. 1, the entire system may be configured by connecting a plurality of energy storage systems 104 under a power grid node 105. In this case, a total output value for the frequency control of the entire system may be determined by distributing the output values of a plurality of energy storage systems 104 through the power management system 101 and the energy storage system controller 102. That is, the power management system 101 may generally manage the entire system and control the output values of a plurality of local management systems 103, and a single local management system 103 may control the output values of the energy storage systems 104 using a single energy storage system controller 102. In this case, the local management system 103 may be implemented as a control room such as a dumpster house or an office provided with one or more energy storage systems 104, and a plurality of control rooms depending to the entire system capacity.

Figure 2:
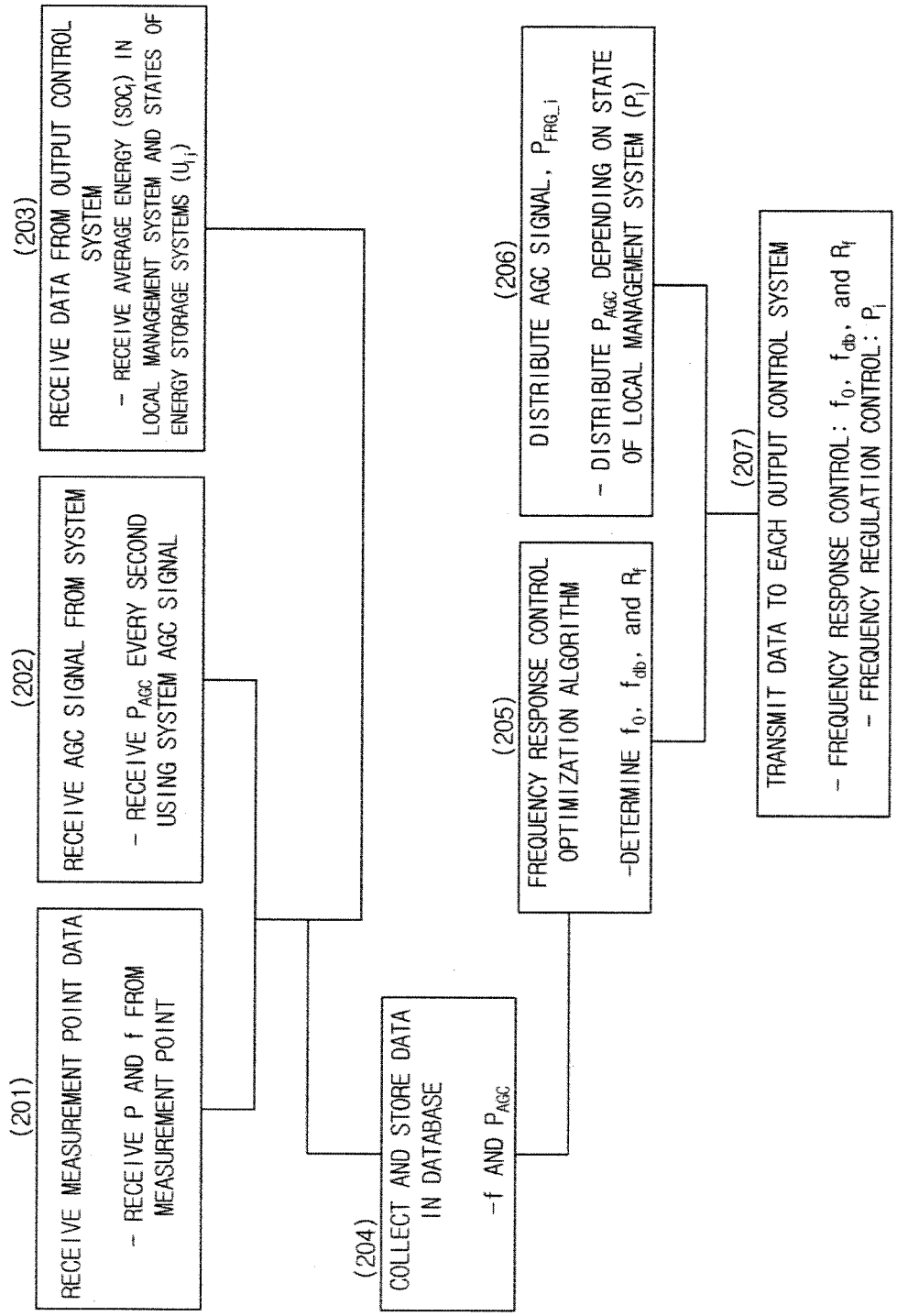
FIG. 2 is a flowchart illustrating a control algorithm of a power management system according to an embodiment of the present invention.

FIG. 2 is a flowchart illustrating a control algorithm of the power management system according to an embodiment of the present invention.

As illustrated in FIG. 2, a power grid frequency control method for multiple energy storage systems according to the present invention may be implemented by the power management system.

First, the power management system may receive measurement point data and an automatic generation control (AGC) signal transmitted from the power grid (steps 201 and 202). The measurement point data may include energy (that is, power) output value P and a power grid frequency f measured at a particular measurement point. The AGC signal may include an AGC instruction value $P_{AGC}$ received from a system operator. For example, the power management system may receive the AGC instruction value $P_{AGC}$ transmitted from the system every four seconds.

The power management system may further receive data transmitted from the energy storage system controller (step 203). The data transmitted from the energy storage system controller includes states $U_{ij}$ of the energy storage systems belonging to the local management system and an average energy amount $SOC_i$. The power management system may receive the average energy amount of the energy storage systems belonging to the local management system from the energy storage system controller in order to perform output power distribution depending on states of a plurality of energy storage systems.

In other words, the power management system may receive the AGC signal from a system operator in order to supply the frequency regulation. In addition, in order to perform output power distribution depending on states of a plurality of energy storage systems, the power management system may receive an average energy amount of the energy storage systems belonging to the local management system from the energy storage system controller.

In this case, various types of data including the measurement point data, the AGC signal, and data transmitted from the output control system are collected and stored in database separately provided in the power management system. That is, in order to set participating energy ratios for the frequency response and the frequency regulation, the power management system may store the power grid frequency f and the AGC instruction value $P_{AGC}$ measured at a particular measurement point in database. Therefore, the power management system may perform the frequency response control and the frequency regulation control considering a charging state and a driving state of the energy storage system corresponding to the lowest layer of the hierarchical control structure using the received data. In other words, the step 204 is a step of structuring database for executing an optimal algorithm for the frequency response. In the step 204, only an output power instruction value (that is, the AGC instruction value $P_{AGC}$) within the same time interval as that of the power grid frequency f may be stored. This means the operation of receiving the energy (that is, power) output value P measured from the measurement point in step 201 is to check whether or not an output power corresponding to the instruction value is output.

Figure 6:
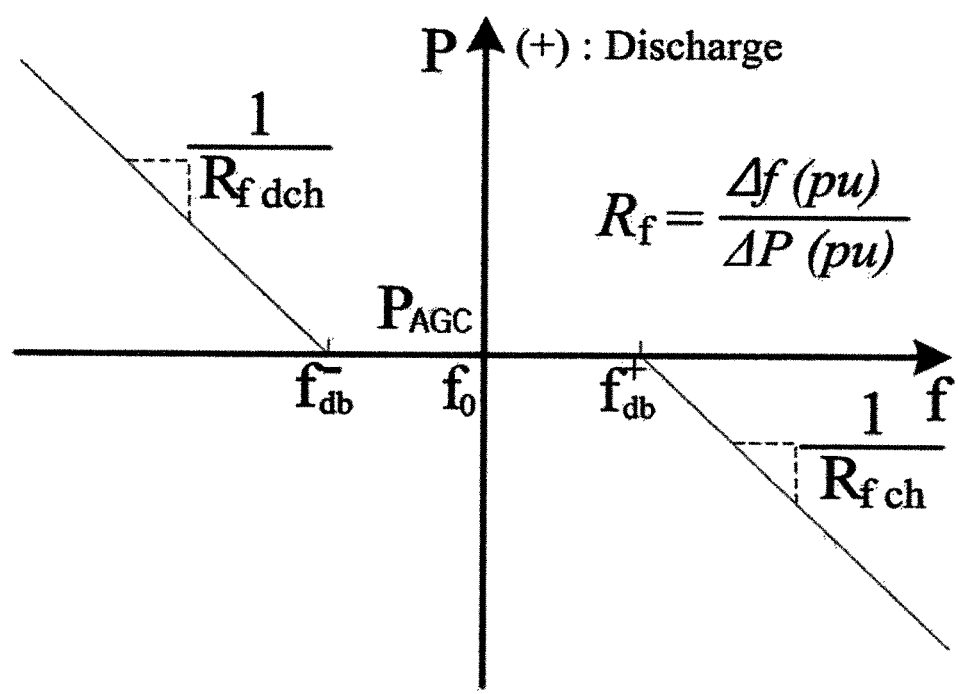
FIG. 6 is a graph illustrating an active power droop control on a frequency region basis for describing a frequency control method for energy storage systems according to the present invention.

Meanwhile, the power management system may determine control parameters for the frequency control of the energy storage system controller using a frequency response control optimization algorithm (step 205). The control parameters may include a reference frequency $f_0$, a frequency dead band $f_{db}$, a P-f droop rate Rf, and the like. In this case, the frequency response control may be performed depending on a state of the power grid frequency, and as illustrated in FIG. 6, the output power may be controlled depending on the AGC signal within a region of the frequency dead band $f_{db}$. Meanwhile, the frequency response control may control additional output power in regions other than the frequency dead band $f_{db}$. The control algorithm for determining the control parameters will be described below in more details with reference to FIG. 3.

Meanwhile, since the energy storage system has an energy restraint, it is necessary to set the participating energy ratio for the frequency response and frequency regulation control depending on a state of the frequency. This course may be performed by the power management system.

Finally, the power management system distributes the AGC signal to transmit data to each energy storage system controller, so as to execute the frequency response control and the frequency regulation control (steps 206 and 207). In this case, the power management system may distribute the AGC signal instruction value $P_{AGC}$ depending on a state of the local management system, and may transmit data for the frequency response control and the frequency regulation control to each energy storage system controller. In this case, the data for the frequency response control may include response control parameters such as a reference frequency $f_0$, the frequency dead band $f_{db}$, and the P-f droop rate $R_f$. In addition, the data for the frequency regulation control may include control parameters such as the AGC output distribution value $P_i$ received by a specific energy storage system controller (for example, the (i)th energy storage system controller).

That is, the power management system may distribute the AGC signal for the frequency regulation to a plurality of energy storage system controllers using a specific control algorithm. The specific control algorithm for distributing the AGC signal to the energy storage system controllers for the frequency regulation will be described below in more details with reference to FIG. 4.

Figure 3:
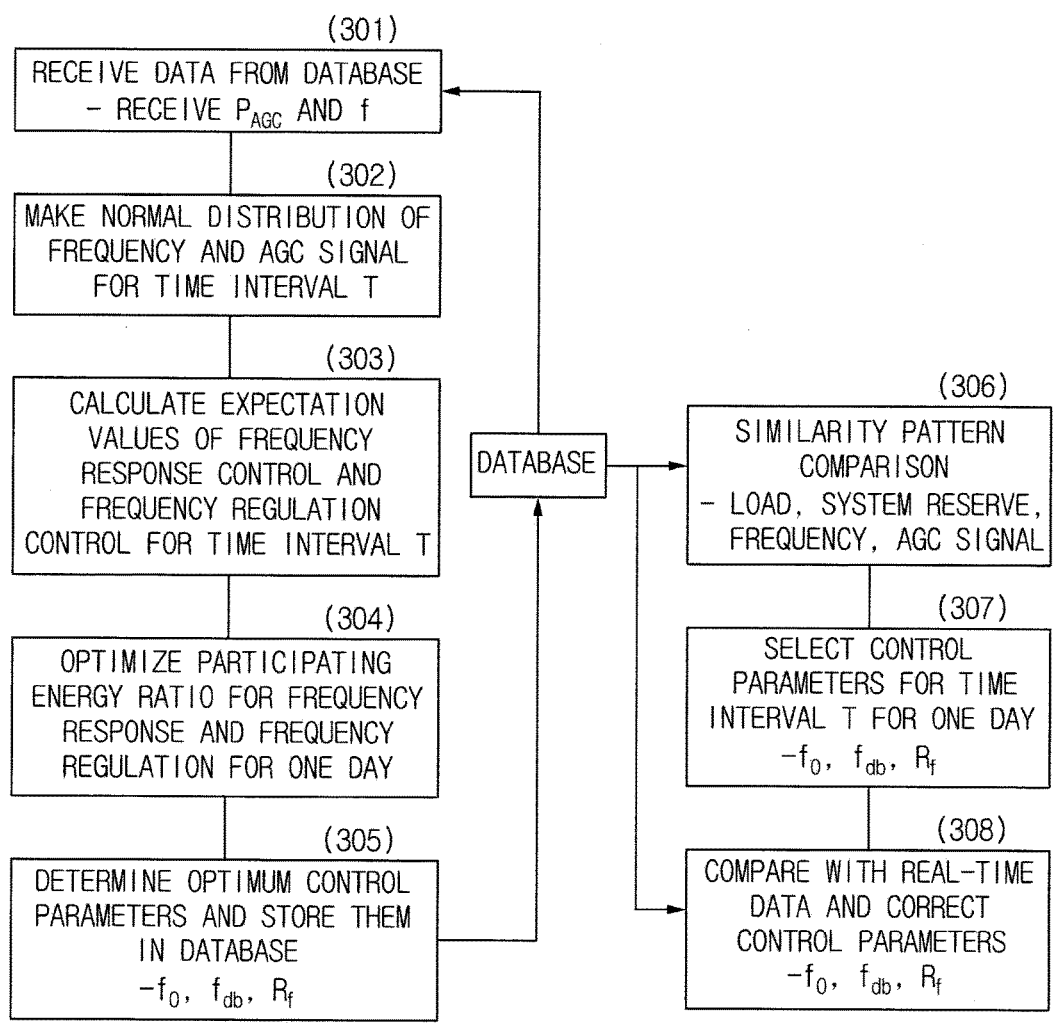
FIG. 3 is a flowchart illustrating a frequency control optimization algorithm according to an embodiment of the present invention.

FIG. 3 is a flowchart illustrating a frequency control optimization algorithm according to an embodiment of the present invention.

As illustrated in FIG. 3, the frequency control optimization algorithm according to the present invention may be implemented as the power management system determines the control parameters for the frequency control of the energy storage system controllers.

First, the power management system may receive data from the database and make a normal distribution of the power grid frequency and the automatic generation control signal for a particular time interval (steps 301 and 302). That is, the participating energy ratio for the frequency response and the frequency regulation may be set on the basis of various types of data stored in the database. For example, the participating energy ratio may be determined using a probability function of the following Formula 1.

$$X_T \sim N_X(\mu_X, \sigma_X^2)_T,$$
$$Y_T \sim N_Y(\mu_Y, \sigma_Y^2)_T, \text{ and}$$
$$f(x) = \frac{1}{\sigma_X \sqrt{2\pi}} e^{-\frac{1}{2}\left(\frac{x-\mu_X}{\sigma_X}\right)^2},$$

[Formula 1]

where "$X_T$" denotes a continuous random variable of a measurement frequency for a time interval T, "$f(x)$" denotes a probability density function of the measurement frequency for a time interval T, "$\mu_X$" denotes a mean value of the measurement frequency for a time interval T, "$\sigma_X$" denotes a standard deviation of the measurement frequency for a time interval T, "$Y_T$" denotes a continuous random variable of the AGC signal for a time interval T, "$\mu_Y$" denotes a mean value of the AGC signal for a time interval T, and "$\sigma_Y$" denotes a standard deviation of the AGC signal for a time interval T.

Then, the power management system may calculate the expectation value of the frequency response control and the frequency regulation control for the particular time interval (step 303). That is, a probability and an expectation value of a frequency region responding to the frequency response control may be obtained using a normal distribution function, and an expectation value of the output of the frequency response control may be obtained using a P-f droop coefficient. An output expectation value of the AGC signal of the frequency regulation control is equal to a mean value, which can be obtained on the basis of the following Formula 2.

$$E[P_{FRS}^{DB,T}]_{T,ch} = \frac{1}{R_f} \times \frac{P_{Tot}^{rate}}{f_{rate}} \left[ f_0 + f_{db} - \int_{f_0+f_{db}}^{\infty} xf(x)dx \right], \text{ and}$$

$$E[P_{FRS}^{DB,T}]_{T,ch} = \frac{1}{R_f} \times \frac{P_{Tot}^{rate}}{f_{rate}} \left[ f_0 + f_{db} - \int^{\infty} f_0 + f_{db} xf(x)dx \right],$$

[Formula 2]

where "$f_0$" denotes a reference frequency,

"$f_{db}$" denotes a frequency dead band,

"$f_{rate}$" denotes a system commercial frequency, that is, 60 Hz,

"Rf" denotes a P-f droop coefficient,

"$P_{Tot}^{rate}$" denotes a rating output power of the entire system,

"$P_{AGC}^{DB,T}$" denotes an AGC instruction value for a time interval T stored in the database, "$E[P_{FRS}^{DB,T}]_T$" denotes an expectation value of the output power of the frequency response control for a time interval T, and "$E[P_{AGC}^{DB,T}]_T$" denotes an expectation value of the output power of the frequency regulation control for a time interval T.

The power management system may determine optimum control parameters and store them in the database by optimizing the participating energy ratio for the frequency response and the frequency regulation for a day (steps 304 and 305). That is, the participating energy ratio for the frequency response and the frequency regulation for a day may be set using an optimization algorithm, and the P-f droop coefficient and the control parameters of the reference frequency for the time interval T may be finally determined. In general, the frequency dead band is set at the initial stage depending on the applied power system provision. However, the frequency dead band may be obtained by setting it as a variable of the optimization algorithm according to the present invention. The optimum control parameters determined as described above may be stored in the database, and the control parameters for the time interval T may be selected using a load prediction and a similarity pattern analysis for the frequency and the AGC signal. The following Formula 3 expresses an optimization algorithm for setting the participating energy ratio for the frequency response an the frequency regulation for a day.

$$\max \sum_{T=0}^{24h} P(f_0)_T,$$

$$P(f_0)_T = E[P_{FRS}^{DB,T}]_T + E[P_{AGC}^{DB,T}]_T,$$

$$SOC_{min} \leq SOC_T \leq SOC_{max},$$

$$SOC_T = SOC_{T-1} + \eta_c \frac{P(f_0)_T}{Q_C} \Delta t, (P(f_0)_T < 0), \text{ and}$$

$$SOC_T = SOC_{T-1} - \frac{1}{\eta_d} \frac{P(f_0)_T}{Q_C} \Delta t, (P(f_0)_T > 0),$$

[Formula 3]

where "$P(f_0)_T$" denotes an optimization function for the output power of the entire system for a time interval T, "$SOC_T$" denotes an average energy amount in the entire system for a time interval T, "$SOC_{T-1}$" denotes an average energy amount in the entire system for a time interval (T-1), "$Q_C$" denotes a maximum total energy amount in the entire system.

"$\eta_d$" denotes a discharging efficiency of an energy storage system ($0 \leq \eta_d \leq 1$), and "$\eta_c$" denotes a charging efficiency of an energy storage system ($0 \leq \eta_c \leq 1$).

The power management system may select control parameters for a particular time interval of the day through a similarity pattern analysis using the data stored in the database (steps 306 and 307). In the control algorithm of the power management system, the algorithm for distributing the AGC signal for the frequency regulation to a plurality of energy storage system controllers is established in the following Formula 4.

$$P_i^{dch} = \frac{SOC_i}{\sum_{i=1}^{N} SOC_i} \times P_{AGC}, (P_{AGC} > 0), \text{ and}$$

[Formula 4]

-continued $$P_i^{dch} = \frac{1 - SOC_i}{\sum_{i=1}^{N} SOC_i} \times P_{AGC}, (P_{AGC} < 0),$$

where "$SOC_i$" denotes an average energy received from the (i)th energy storage system controller, "$P_{AGC}$" denotes an AGC instruction value received from a system operator, and "$P_i$" denotes an AGC output distribution value transmitted to the (i)th energy storage system controller ("dch" denotes discharging, "ch" denotes charging).

Figure 4:
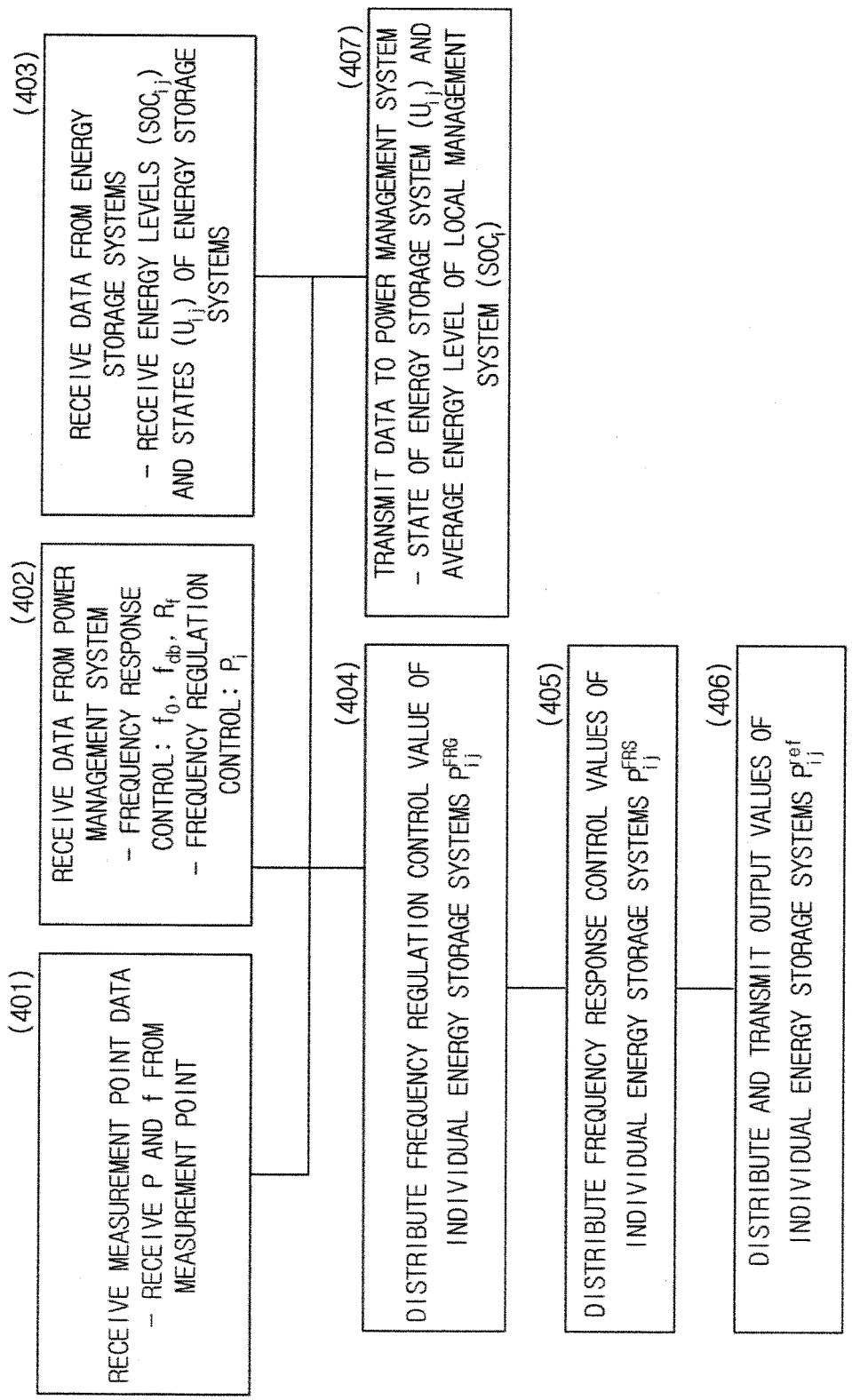
FIG. 4 is a flowchart illustrating a control algorithm of an energy storage system controller according to an embodiment of the present invention.

FIG. 4 is a flowchart illustrating a control algorithm for the energy storage system controllers according to an embodiment of the present invention.

As illustrated in FIG. 4, the energy storage system controller according to the present invention may determine and instruct the output value of the energy storage system of the lowest control layer considering a charging state and a driving state.

First, the energy storage system controller may receive various types of data from the measurement point, the power management system, and the energy storage system (steps 401, 402, and 403). In this case, the data received from the measurement point may include an energy (that is, power) output value P and a power grid frequency f measured at a particular measurement point. The data received from the power management system may include frequency response control parameters such as a value of the reference frequency $f_0$, the frequency dead band $f_{db}$, and the P-f droop rate $R_f$, and frequency regulation control parameters such as an AGC output distribution value $P_i$ received by a particular energy storage system controller (for example, the (i)th energy storage system controller). In addition, the data received from the energy storage system may include the energy amount $SOC_{ij}$ and the state $U_{ij}$ of the energy storage system.

Then, the energy storage system controller may distribute the frequency regulation control values of individual energy storage systems belonging to the local management system (step 404). A control algorithm for distributing the regulation control values for the individual energy storage systems is established in the following Formula 5.

$$P_{ij}^{FRG} = \frac{U_{ij} SOC_{ij}}{\sum_{j=1}^{M} U_{ij} SOC_{ij}} \times P_i^{dch}, (P_{AGC} > 0), \text{ and} \quad \text{[Formula 5]}$$

$$P_{ij}^{FRG} = \frac{U_{ij}(1 - SOC_{ij})}{\sum_{j=1}^{M} U_{ij} SOC_{ij}} \times P_i^{ch}, (P_{AGC} < 0),$$

where "$P_i$" denotes the AGC output distribution value received by the (i)th energy storage system controller ("dch" denotes discharging, and "ch" denotes charging), "$U_{ij}$" denotes a driving state variable received from the (j)th energy storage system in the (i)th local management system ("on" refers to a binary number "1," and "off" refer to a binary number "0"), "$SOC_{ij}$" denotes an energy amount received from the (j)th energy storage system in the (i)th local management system, and "$P_i^{FRG}$" denotes a frequency regulation output distribution value of the (j)th energy storage system in the (i)th local management system.

The energy storage system controller may distribute frequency response control values of individual energy storage systems (step 405). A control algorithm for distributing the frequency response control values of the individual energy storage systems is established in the following Formula 6.

$$P_{ij}^{FRS} = \frac{U_{ij}}{\sum_{j=1}^{M} U_{ij}} \frac{1}{R_{f,dch}} [(f_0 - f_{db}^-) - f], \quad \text{[Formula 6]}$$

$(f < (f_0 - f_{db}^-))$, and $$P_{ij}^{FRS} = \frac{U_{ij}}{\sum_{j=1}^{M} U_{ij}} \frac{1}{R_{f,ch}} [(f_0 + f_{db}^+) - f],$$

$(f > (f_0 + f_{db}^+))$, where "$f_0$" denotes a reference frequency,

"$[f^-_{db}, f^+_{db}]$" denotes a frequency dead band,

"f" denotes a real measurement frequency,

"$R_f$" denotes a p-f droop coefficient ("dch" denotes discharging, and "ch" denotes "charging"), and "$P_{ij}^{FRS}$" denotes a frequency response output distribution value of the (j)th energy storage system in the (i)th local management system.

Then, the energy storage system controller may distribute the output values of the individual energy storage systems determined as described above to transmit them to each energy storage system (step 406). In this case, considering a restriction to the maximum and minimum output powers of the energy storage system, the final output value can be determined as described in the following Formula 7, and the output value determined as described above may be transmitted to the energy storage systems.

$$P_{ij}^{ref} = P_{ij}^{FRG} + P_{ij}^{FRS},$$

and $$-P_{ij}^{max} \leq P_{ij}^{ref} \leq +P_{ij}^{max}. \quad \text{[Formula 7]}$$

Meanwhile, the energy storage system controller may transmit data on the states of the individual energy storage systems $U_{ij}$ and the average energy amount $SOC_i$ of the local management system to the power management system (step 407). That is, the energy storage system controller may calculate the average energy amount of a plurality of energy storage systems belonging to the local management system using the following Formula 8 and transmit the calculated average energy amount to the power management system.

$$SOC_{ij}(t) = SOC_{ij}(t-1) - U_{ij} \frac{1}{\eta_d} \frac{P_{ij}^{ref}}{Q_C} \Delta t, (P_{ij}^{ref} > 0), \quad \text{[Formula 8]}$$

$$SOC_{ij}(t) = SOC_{ij}(t-1) + U_{ij} \frac{1}{\eta_c} \frac{P_{ij}^{ref}}{Q_C} \Delta t, (P_{ij}^{ref} < 0),$$

and $$SOC_i = \left( \sum_{j=1}^{M} U_{ij} SOC_{ij} \right) \div M.$$

Figure 5:
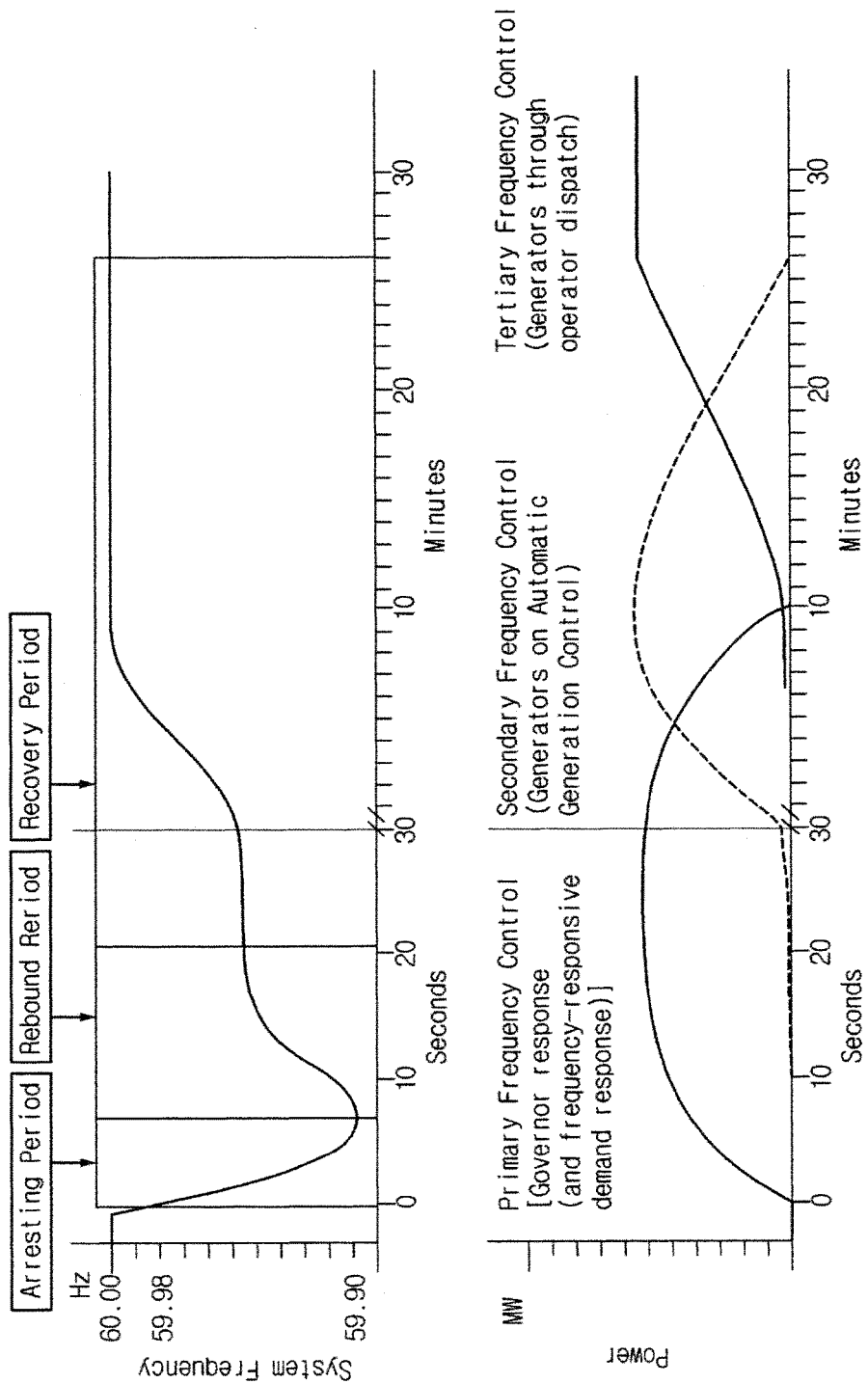
FIG. 5 is a sectional frequency variation graph schematically illustrating a power grid frequency control method according to the present invention.

FIG. 5 is a sectional frequency variation graph schematically illustrating a power grid frequency control method according to the present invention.

As illustrated in FIG. 5, the energy storage systems according to an embodiment of the present invention may be classified depending on a response speed to control the power grid frequency.

The energy storage systems may be classified into a frequency response or primary frequency control, a frequency regulation or secondary frequency control, and an economic dispatch or tertiary frequency control. According to the present invention, the frequency response and the frequency regulation may be supplied using at least one energy storage system having a fast output response speed in the aforementioned hierarchical classification.

FIG. 6 is a graph illustrating an active power droop control for each frequency region for describing a frequency control method for energy storage systems according to the present invention.

As illustrated in FIG. 6, the frequency control method for the energy storage systems according to the present invention may be implemented by applying a droop control to the active power on a frequency region basis. That is, in the frequency control method for the energy storage systems according to the present invention, the output power may be controlled depending on the AGC power signal inside the area of the frequency dead band, and the frequency response control may be performed by controlling additional output powers in the areas other than the frequency dead band.

In this case, "$f_0$" denotes the reference frequency, "$f_{db}$" denotes the frequency dead band. In addition, "$P_{AGC}$" denotes an output signal transferred for the frequency regulation control from the upper layer (that is, the AGC power signal). The droop control may be performed using the droop coefficient. The droop coefficient for the charging/discharging can be obtained using the following Formula 9.

$$R_F = \frac{\Delta f(pu)}{\Delta P(pu)}, \quad \text{[Formula 9]}$$

where "$\Delta f(pu)$" denotes an active power change amount, and "$\Delta P(pu)$" denotes a frequency change amount in a non-dead band. The droop coefficient may be different between the charging and discharging operations.

Figure 7:
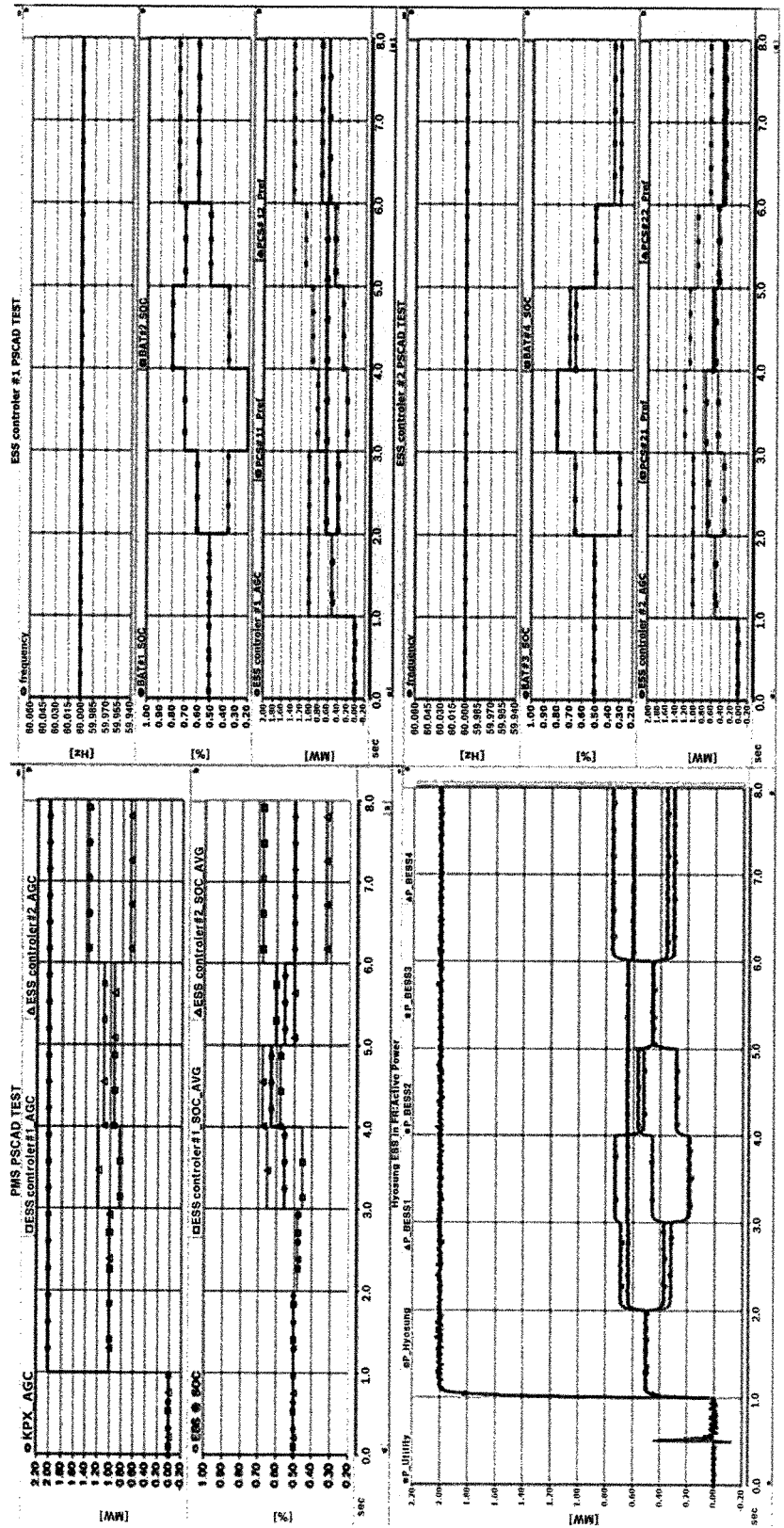
FIGS. 7 and 8 are exemplary diagrams illustrating a simulation result for analyzing output value distribution to the energy storage systems according to the present invention.
Figure 8:
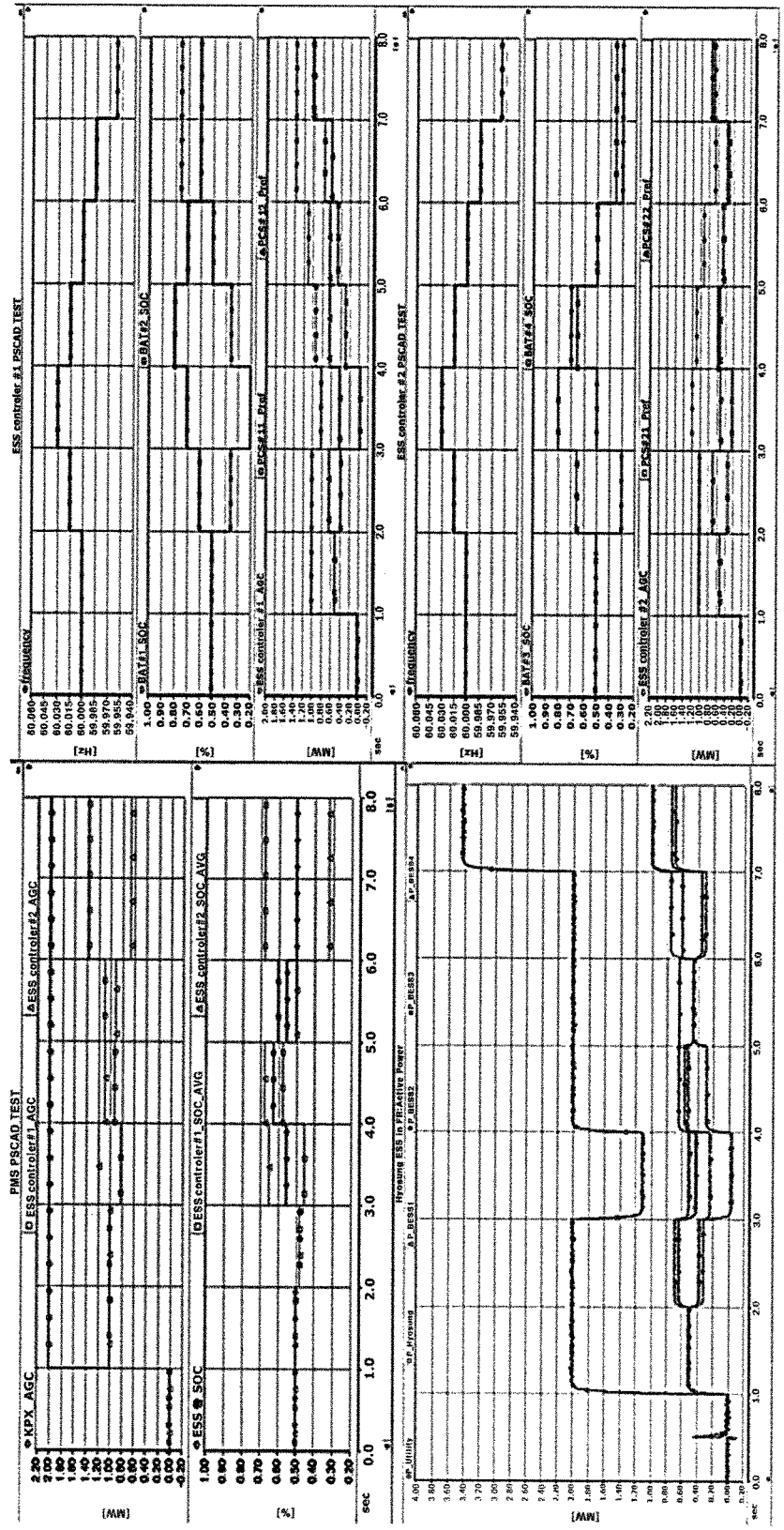

FIGS. 7 and 8 are exemplary diagrams illustrating a simulation result for analyzing output value distribution to the energy storage systems according to the present invention.

FIG. 7 shows a simulation screen for analyzing the output value distribution of the energy storage systems when the power grid frequency is within the dead band ($f_0 \pm f_{db}$). From FIG. 7, it is recognized that the frequency response control is not performed, and the output values of each energy storage system are distributed in response to the AGC signal received from the system operator. In this case, the AGC signal received from the system operator is constant ($P_{AGC}$=2 MW), and the power grid frequency is also constant (f=60 Hz). In addition, the charging states of each energy storage system are variable ($SOC_{ij}$).

Meanwhile, FIG. 8 illustrates a simulation screen for analyzing the output value distribution of the energy storage systems when the power grid frequency is changed. From FIG. 8, it is recognized that the output values of each energy storage system are distributed to the AGC signal received from the system operator and the frequency response control depending on the power grid frequency. In this case, the AGC signal received from the system operator is constant ($P_{AGC}$=2 MW), and the power grid frequency may be variable. In addition, the charging states of each energy storage system are variable ($SOC_{ij}$).

Figure 9:
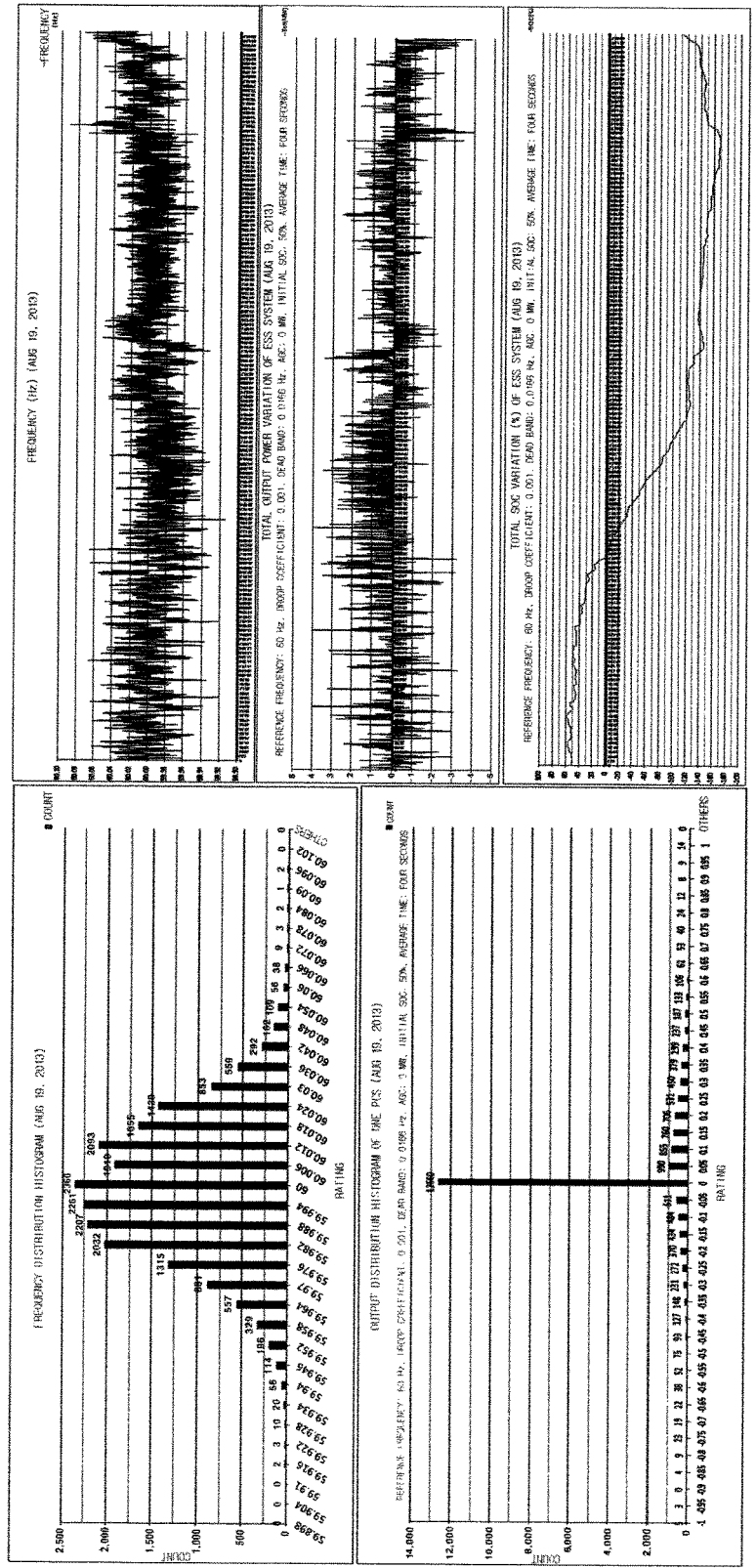
FIGS. 9 and 10 are exemplary diagrams illustrating an analysis result for a total system output power and a total energy amount according to the present invention.
Figure 10:
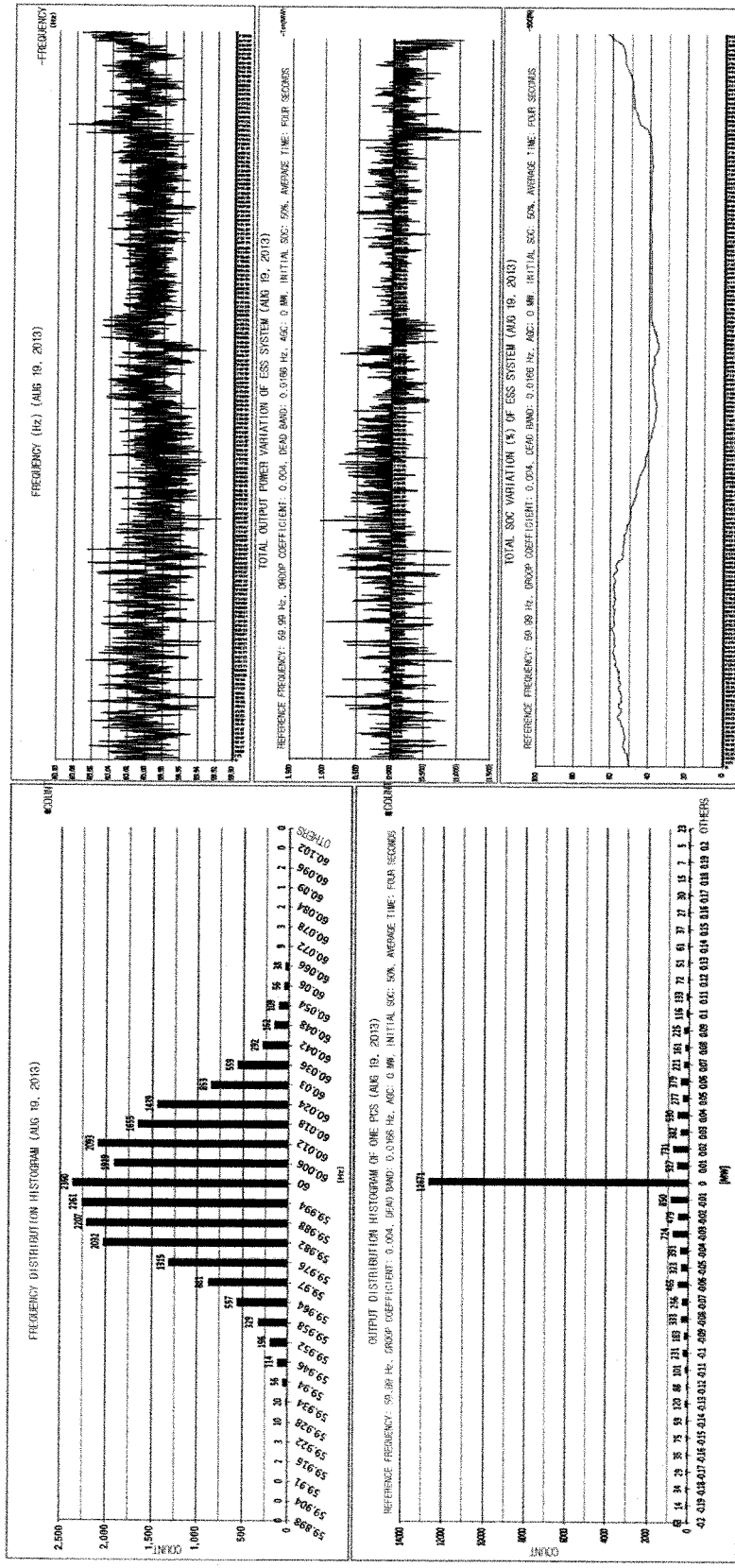

FIGS. 9 and 10 are exemplary diagrams illustrating an analysis result for a total system output and a total energy amount according to the present invention.

FIG. 9 is an exemplary diagram illustrating an analysis result for a total system output and a total energy amount depending on a frequency analysis and a control parameter when a control optimization algorithm according to the present invention is not employed. FIG. 9 shows an analysis result for a total system output and a change of the energy amount depending on a fixed control parameter. In this case, the reference frequency may b set to 60 Hz, the droop coefficient may be set to 0.001, the dead band may be set to ±0.0166 Hz, the automatic generation control may be set to 0 MW, the average energy amount may be set to 50%, the frequency average time may be set to four seconds, and the charging/discharging efficiency may be set to 90%.

Meanwhile, FIG. 10 illustrates an analysis result for a total system output and a change of the energy amount when the control parameters are changed to suitable values using the control optimization algorithm according to the present invention. In this case, the reference frequency may b set to 59.994 Hz (decreased by about 0.01%), the droop coefficient may be set to 0.004, the dead band may be set to ±0.0166 Hz, the automatic generation control may be set to 0 MW, the average energy amount may be set to 50%, the frequency average time may be set to four seconds, and the charging/discharging efficiency may be set to 90%.

As described above, the power grid frequency control method and the power grid frequency control system for multiple energy storage systems according to the present invention is advantageous in that the frequency response control set depending on the reference frequency, the frequency dead band, and the p-f droop rate is additionally supplied, and system extensibility and flexibility can be improved using a hierarchical structure unlike the conventional method in which the frequency response control is supplied depending on the AGC signal received from the system operator.

While the present invention has been described hereinbefore regarding particular matters such as specific elements and limited embodiments and drawings, it would be appreciated that these are merely for illustrative purposes and are not intended to limit the scope of the invention. A person ordinarily skilled in the art would conceive various changes and modifications by studying this disclosure.

Therefore, it should be noted that the spirit of the present invention is not to be determined solely by the embodiments described herein in a limitative sense, and the scope of the present invention encompasses not only the claims set forth below, but also their equivalents and variations.

INDUSTRIAL APPLICABILITY

The present invention relates to a power grid frequency control method and the power grid frequency control system for multiple energy storage systems and is applicable to the fields of energy storage devices and systems.

The invention claimed is:

1. A power grid frequency control system for controlling a power grid frequency for multiple energy storage systems using a hierarchical control structure, comprising:
a plurality of energy storage systems (ESSs);
a local management system (LMS) configured to manage at least one of the energy storage systems on a local basis;

an energy storage system controller (ESS controller) configured to generally control the local management system by determining a state of the local management system, estimating an output value of at least one of the energy storage systems belonging to the local management system, and transmitting the estimated output value to each energy storage system; and a power management system (PMS) configured to generally manage overall systems including the plurality of energy storage systems, the local management system, and the energy storage system controller, determine states of the overall systems to allow a user to participate in a power grid frequency control market by making a contract with a system operator, control an output value of the local management system, and regulate control parameters for controlling the output value, wherein, when a plurality of energy storage system controllers are provided, the power management system determines control parameters for controlling frequencies of the energy storage system controllers, sets a participating energy ratio for a frequency response and frequency regulation control depending on a frequency state on the basis of the determined control parameters, and performs the frequency response and frequency regulation control depending on the set participating energy ratio, wherein the power management system analyzes the power grid frequency and an automatic generation control (AGC) signal, makes a normal distribution of the power grid frequency and the AGC signal within a particular time interval, calculates an output expectation value for the frequency response control and an output expectation value of the AGC signal for the frequency regulation control within the particular time interval, optimizes the participating energy ratio for the frequency response and the frequency regulation for a day, and sets a result of the optimization as the participating energy ratio for the frequency response and the frequency regulation.

2. The power grid frequency control system according to claim 1, wherein the power management system determines optimum control parameters on the basis of the optimized participating energy ratio, and further selects parameters for a particular time interval out of the determined optimum control parameters using a load prediction and a similarity pattern analysis for the power grid frequency and the AGC signal.

3. The power grid frequency control system according to claim 1, wherein the power management system receives the AGC signal transmitted from a system operator and an average energy amount of the energy storage systems belonging to the local management system transmitted from the energy storage system controller, measures a power grid frequency from a measurement point to set the participating energy ratio for the frequency response and the frequency regulation, and performs the frequency response and frequency regulation control considering a charging state and a driving state of the energy storage system having the lowest energy amount out of the energy storage systems belonging to the local management system on the basis of the received AGC signal and the measured power grid frequency.

4. The power grid frequency control system according to claim 1, wherein the energy storage system controller receives data for performing the frequency response and frequency regulation control from the power management system, receives states and energy amounts from each of the energy storage systems belonging to the local management system, calculates an average energy amount of the local management system on the basis of the received data and the states and energy amounts of each energy storage systems, and transmits the average energy amount to the power management system.

5. The power grid frequency control system according to claim 4, wherein the energy storage system controller distributes frequency regulation control values and frequency response control values of each energy storage system belonging to the local management system on the basis of the data received from the power management system and the states and energy amounts of each energy storage system, determines final output values of each energy storage system on the basis of the distributed frequency regulation control value and the distributed frequency response control value, and transmits the determined final output values to the power management system.

6. A power grid frequency control method in a power grid frequency control system including a plurality of energy storage systems (ESSs), a local management system (LMS) configured to manage at least one of the energy storage systems on a local basis, an energy storage system controller (ESS controller) configured to generally control the local management system by determining a state of the local management system, estimating an output value of at least one of the energy storage systems belonging to the local management system, and transmitting the estimated output value to each energy storage system, and a power management system (PMS) configured to generally manage overall systems including the plurality of energy storage systems, the local management system, and the energy storage system controller, determine states of the overall systems to allow a user to participate in a power grid frequency control market by making a contract with a system operator, control an output value of the local management system, and regulate control parameters for controlling the output value, the power grid frequency control method comprising:
determining control parameters for controlling frequencies of the energy storage system controllers when a plurality of energy storage system controllers are provided;
setting a participating energy ratio for a frequency response and frequency regulation control depending on a frequency state on the basis of the determined control parameters; and
performing the frequency response and frequency regulation control depending on the set participating energy ratio,
wherein the setting the participating energy ratio for the frequency response and frequency regulation control includes allowing the power management system to analyze the power grid frequency and an automatic generation control (AGC) signal, making a normal distribution of the power grid frequency and the AGC signal within a particular time interval on the basis of a result of the analysis, calculating an output expectation value for the frequency response control and an output expectation value of the AGC signal for the frequency regulation control within the particular time interval, and optimizing the participating energy ratio for the frequency response and the frequency regulation to set a result of the optimization as the participating energy ratio for the frequency response and the frequency regulation.

7. The power grid frequency control method according to claim 6, wherein the power management system determines optimum control parameters on the basis of the optimized participating energy ratio, and further selects parameters for a particular time interval out of the determined optimum control parameters using a load prediction and a similarity pattern analysis for the power grid frequency and the AGC signal.

8. The power grid frequency control method according to claim 6, wherein the performing the frequency response and frequency regulation control includes allowing the power management system to receive the AGC signal transmitted from a system operator and an average energy amount of the energy storage systems belonging to the local management system transmitted from the energy storage system controller and measuring a power grid frequency from a measurement point, and performing the frequency response and frequency regulation control considering a charging state and a driving state of the energy storage system having the lowest energy amount out of the energy storage systems belonging to the local management system on the basis of the received AGC signal and the measured power grid frequency.

9. The power grid frequency control method according to claim 6, wherein the energy storage system controller receives data for performing the frequency response and frequency regulation control from the power management system, receives states and energy amounts from each of the energy storage systems belonging to the local management system, calculates an average energy amount of the local management system on the basis of the received data and the states and energy amounts of each energy storage systems, and transmits the average energy amount to the power management system.

10. The power grid frequency control method according to claim 9, wherein the energy storage system controller distributes frequency regulation control values and frequency response control values of each energy storage system belonging to the local management system on the basis of the data received from the power management system and the states and energy amounts of each energy storage system, determines final output values of each energy storage system on the basis of the distributed frequency regulation control value and the distributed frequency response control value, and transmits the determined final output values to the power management system.

\* \* \* \* \*